US011749745B2

(12) United States Patent
Hu

(10) Patent No.: US 11,749,745 B2
(45) Date of Patent: Sep. 5, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Xiang Hu, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 142 days.

(21) Appl. No.: 17/219,982

(22) Filed: Apr. 1, 2021

(65) Prior Publication Data

US 2021/0336030 A1 Oct. 28, 2021

(30) Foreign Application Priority Data

Apr. 26, 2020 (CN) .......................... 202010339099.3

(51) Int. Cl.
*H01L 29/66* (2006.01)
*H01L 21/8234* (2006.01)
*H01L 29/78* (2006.01)

(52) U.S. Cl.
CPC .. *H01L 29/6681* (2013.01); *H01L 21/823431* (2013.01); *H01L 29/7851* (2013.01)

(58) Field of Classification Search
CPC ............ H01L 29/6681; H01L 29/7851; H01L 21/823431
See application file for complete search history.

(56) References Cited

U.S. PATENT DOCUMENTS

| 9,508,825 | B1* | 11/2016 | Basker | ............. H01L 29/66545 |
| 2018/0174904 | A1* | 6/2018 | Hsieh | ................. H01L 23/5226 |
| 2021/0272893 | A1* | 9/2021 | Song | ................ H01L 21/76832 |

* cited by examiner

*Primary Examiner* — Christine A Enad
(74) *Attorney, Agent, or Firm* — Anova Law Group, PLLC

(57) ABSTRACT

A semiconductor structure and a method for forming the semiconductor structure are provided. The semiconductor structure includes a substrate, and a first dielectric layer, a first gate structure and a plurality of second gate structures over the substrate. A second protection layer is formed on a top of a second gate structure. A first source-drain doped layer is formed between the first gate structure and an adjacent second gate structure. The first dielectric layer covers sidewalls of the first and second gate structures, and exposes a top surface of the second protection layer. The semiconductor structure also includes a first conductive structure in the first dielectric layer over the first source-drain doped layer, and a conductive layer on the first gate structure and the first conductive structure. A top surface of the conductive layer is coplanar with a top surface of the first dielectric layer.

15 Claims, 5 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 202010339099.3, filed on Apr. 26, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the rapid development of semiconductor manufacturing technology, semiconductor devices have been developed towards higher component density and higher integration degree. For example, flash memory has been used as a storage device in electronic devices such as a digital camera, a notebook computer, or a tablet computer, etc. Therefore, reducing the size of the flash memory unit and thereby reducing the cost of the flash memory is one of directions of technological development. For a NOR gate tunneling oxide electrically erasable flash memory, a self-aligned contact process is used to fabricate a conductive structure on the surfaces of a source region and a drain region, which can meet the requirements of forming the flash memory with a substantially small size.

However, the performance of the existing semiconductor structure formed by the self-aligned contact process still needs to be improved. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate, and a first dielectric layer, a first gate structure and a plurality of second gate structures over the substrate. The first gate structure is adjacent to at least one of the plurality of second gate structures. A second protection layer is formed on a top of a second gate structure of the plurality of second gate structures. A first source-drain doped layer is formed between the first gate structure and an adjacent second gate structure of the at least one second gate structure. The first dielectric layer covers a sidewall of the first gate structure and a sidewall of the second gate structure, and exposes a top surface of the second protection layer. The semiconductor structure also includes a first conductive structure in the first dielectric layer over the first source-drain doped layer, and a conductive layer on the first gate structure and the first conductive structure. A top surface of the conductive layer is coplanar with a top surface of the first dielectric layer.

Optionally, the semiconductor structure further includes a second source-drain doped layer formed in the substrate between adjacent second gate structures of the plurality of second gate structures, a second conductive structure formed in the first dielectric layer over the second source-drain doped layer, and a fourth protection layer formed on a top of the second conductive structure.

Optionally, the semiconductor structure further includes a second dielectric layer formed over the first dielectric layer, the conductive layer, the second protection layer, and the fourth protection layer, and a source-drain plug and a gate plug formed in the second dielectric layer. The second dielectric layer exposes top surfaces of the source-drain plug and the gate plug. The source-drain plug is extended into an inside of the first dielectric layer, and is in contact with a portion of the second conductive structure. The gate plug is extended into an inside of the first dielectric layer, and is in contact with a portion of the second gate structure.

Optionally, the substrate includes a base and a plurality of discrete fins formed on the base. The first gate structure is across a length portion of a fin of the plurality of discrete fins, and covers a portion of sidewall and top surfaces of the fin. The second gate structure is across a length portion of the fin, and covers a portion of sidewall and top surfaces of the fin.

Optionally, the first source-drain doped layer is formed in the fin, and the second source-drain doped layer is formed in the fin.

Optionally, the first gate structure includes a first gate dielectric layer and a first gate electrode layer formed over the first gate dielectric layer, and the second gate structure includes a second gate dielectric layer and a second gate electrode layer formed over the second gate dielectric layer.

Optionally, the conductive layer is made of a material including a metal, and the metal includes tungsten, aluminum, copper, titanium, silver, gold, lead, nickel, or a combination thereof.

Optionally, the first conductive structure is made of a material including a metal, and the metal includes tungsten, aluminum, copper, titanium, silver, gold, lead, nickel, or a combination thereof.

Optionally, the second conductive structure is made of a material including a metal, and the metal includes tungsten, aluminum, copper, titanium, silver, gold, lead, nickel, or a combination thereof.

Another aspect of the present disclosure includes a method for forming a semiconductor structure. The method includes providing a substrate, and forming a first dielectric layer a first gate structure and a plurality of second gate structures over the substrate. The first gate structure is adjacent to at least one of the plurality of second gate structures. A first protection layer is formed on a top of the first gate structure, and a second protection layer is formed on a top of a second gate structure of the plurality of second gate structures. A first source-drain doped layer is formed between the first gate structure and an adjacent second gate structure of the at least one second gate structure. The first dielectric layer covers a sidewall of the first gate structure and a sidewall of the second gate structure, and exposes top surfaces of the first protection layer and the second protection layer. The method also includes forming a first conductive structure in the first dielectric layer over the first source-drain doped layer, and forming a third protection layer on a top of the first conductive structure. Further, the method includes forming a conductive layer opening in the first dielectric layer by removing the first protection layer and the third protection layer, and forming a conductive layer in the conductive layer opening. A top surface of the conductive layer is coplanar with a top surface of the first dielectric layer.

Optionally, before forming the conductive layer opening, the method further includes forming a second source-drain doped layer in the substrate between adjacent second gate structures of the plurality of second gate structures, forming a second conductive structure in the first dielectric layer over the second source-drain doped layer, and forming a fourth protection layer on a top of the second conductive structure.

Optionally, the first conductive structure and the second conductive structure are simultaneously formed.

Optionally, forming the first conductive structure and the second conductive structure includes: forming a first source-drain conductive opening and a second source-drain conductive opening in the first dielectric layer, where the first source-drain conductive opening exposes a top surface of the first source-drain doped layer, and the second source-drain conductive opening exposes a top surface of the second source-drain doped layer; forming an initial conductive structure in the first source-drain conductive opening and the second source-drain conductive opening; back-etching the initial conductive structure to form the first conductive structure and the second conductive structure; and forming the third protection layer over the first conductive structure, and forming the fourth protection layer over the second conductive structure.

Optionally, after forming the conductive layer, the method further includes: forming a second dielectric layer over the first dielectric layer, the conductive layer, the second protection layer, and the fourth protection layer; and forming a source-drain plug and a gate plug in the second dielectric layer. The second dielectric layer exposes top surfaces of the source-drain plug and the gate plug. The source-drain plug is extended into an inside of the first dielectric layer, and is in contact with a portion of the second conductive structure. The gate plug is extended into an inside of the first dielectric layer, and is in contact with a portion of the second gate structure.

Optionally, the source-drain plug and the gate plug are simultaneously formed.

Optionally, forming the source-drain plug and the gate plug includes: forming a first patterned layer over the second dielectric layer, where the first patterned layer exposes a portion of a top surface of the second dielectric layer; etching the second dielectric layer using the first patterned layer as a mask, to form a first source-drain plug opening and a first gate plug opening in the second dielectric layer, where the first source-drain plug opening exposes a portion of a top surface of the fourth protection layer, and the first gate plug opening exposes a portion of a top surface of the second protection layer; etching the portion of the fourth protection layer exposed by the first source-drain plug opening until a top surface of the second conductive structure is exposed, to form a second source-drain plug opening in the first dielectric layer; etching the portion of the second protection layer exposed by the first gate plug opening until a top surface of the second gate structure is exposed, to form a second gate plug opening in the first dielectric layer; forming the source-drain plug in the first source-drain plug opening and the second source-drain plug opening; and forming the gate plug in the first gate plug opening and the second gate plug opening.

Optionally, forming the first dielectric layer, the first gate structure and the plurality of second gate structures includes: forming a first dummy gate structure and a second dummy gate structure over the substrate; forming the first dielectric layer over the substrate, where the first dielectric layer covers the first dummy gate structure and the second dummy gate structure, and exposes top surfaces of the first dummy gate structure and the second dummy gate structure; removing the first dummy gate structure and the second dummy gate structure, to form a first dummy gate opening and a second dummy gate opening in the first dielectric layer; forming the first gate structure in the first dummy gate opening; forming the second gate structure in the second dummy gate opening; back-etching the first gate structure and the second gate structure, to form a first gate groove on the first gate structure and a second gate groove on the second gate structure; and forming the first protection layer in the first gate groove and the second protection layer in the second gate groove.

Optionally, the substrate includes a base and a plurality of discrete fins formed on the base. The first gate structure is across a length portion of a fin of the plurality of discrete fins, and covers a portion of sidewall and top surfaces of the fin. The second gate structure is across a length portion of the fin, and covers a portion of sidewall and top surfaces of the fin.

Optionally, the first source-drain doped layer is formed in the fin, and the second source-drain doped layer is formed in the fin.

Optionally, the first protection layer and the third protection layer are made of a same material.

The disclosed embodiments may have following beneficial effects. In the disclosed embodiments of the present disclosure, the conductive layer may be formed on the first conductive structure and the first gate structure, to achieve the electrical connection between the first gate structure and the first source-drain doped layer. The top surface of the conductive layer may be coplanar with the top surface of the first dielectric layer. In the subsequent manufacturing process, the second dielectric layer may need to be formed on the conductive layer and the first dielectric layer. The second dielectric layer may effectively reduce the short-circuit between the conductive layer and any other device structure, thereby improving the electrical performance of the ultimately formed semiconductor structure.

In addition, the top surface of the conductive layer may be coplanar with the top surface of the first dielectric layer, such that a certain height difference may be formed between the top surface of the conductive layer and the top surface of the subsequently formed gate plug or the top surface of the subsequently formed source-drain plug, and the spacing between the conductive layer and the gate plug or the source-drain plug may increase, thereby reducing the parasitic capacitance generated between the conductive layer and the gate plug or the source-drain plug.

Further, the first protection layer may be made of a same material as the third protection layer. When removing the first protection layer and the third protection layer to form the conductive layer opening, because the first protection layer and the third protection layer are made of the same material, the etching selection ratios for the first protection layer and the third protection layer may be close, such that the first protection layer and the third protection layer may be simultaneously removed, thereby reducing the process steps and improving production efficiency.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
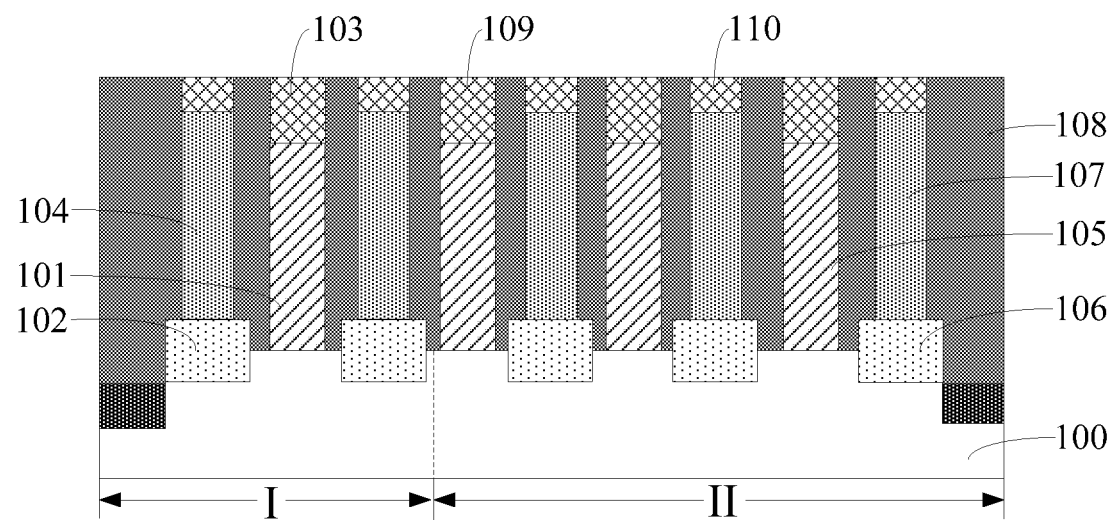
FIGS. 1-2 illustrate semiconductor structures corresponding to certain stages for forming a semiconductor structure.
Figure 2:
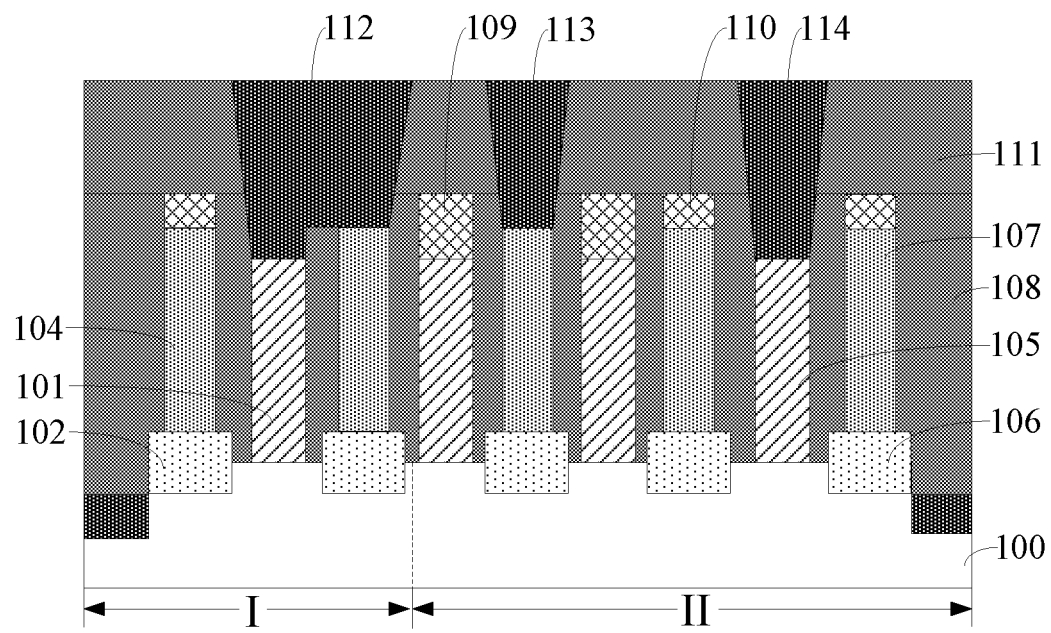

FIGS. 1-2 illustrate semiconductor structures corresponding to certain stages for forming a semiconductor structure. Referring to FIG. 1, a substrate 100 is provided, and the substrate 100 includes a first region I and a second region II. A first gate structure 101 is formed over the first region I, and a first protection layer 103 is formed over the first gate structure 101. A first source-drain doped layer 102 is formed in the first region I, and the first source-drain doped layers 102 are located on both sides of the first gate structure 101. A first conductive structure 104 is formed over the first source-drain doped layer 102. A plurality of second gate structures 105 are formed over the second region II, and a second protection layer 109 is formed over the second gate structure 105. A plurality of second source-drain doped layers 106 are formed in the second region II, and a second source-drain doped layer 106 is located between adjacent second gate structures 105. A second conductive structure 107 is formed over the second source-drain doped layer 106, and a third protection layer 110 is formed over the second conductive structure 107.

A first dielectric layer 108 is formed over the substrate 100, and the first dielectric layer covers the first gate structure 101, the second gate structure 105, the first source-drain doped layer 102, the second source-drain doped layer 106, the first conductive structure 104, the second conductive structure 107, the first protection layer 103, the second protection layer 109, and the third protection layer 110. The first dielectric layer 108 exposes top surfaces of the first conductive structure 104, the second conductive structure 107, the first protection layer 103, the second protection layer 109 and the third protection layer 110.

Referring to FIG. 2, a second dielectric layer 111 is formed over the first dielectric layer 108, the first conductive structure 104, the second conductive structure 107, the first protection layer 103, the second protection layer 109, and the third protection layer 110. A conductive layer 112, a source-drain plug 113 and a gate plug 114 are formed in the second dielectric layer 111, and the second dielectric layer 111 exposes top surfaces of the conductive layer 112, the source-drain plug 113 and the gate plug 114. The conductive layer 112 is extended into an inside of the first dielectric layer 108, and is in contact with the first gate structure 101 and the first conductive structure 104. The source-drain plug 113 is extended into an inside of the first dielectric layer 108, and is in contact with a portion of the second conductive structure 107. The gate plug 114 is extended into an inside of the first dielectric layer 108, and is in contact with a portion of the second gate structure 105.

In one embodiment, according to the design requirements of the electrical structure of the semiconductor structure, the first gate structure 101 needs to be electrically connected to the first conductive structure 104 through the conductive layer 112, and the conductive layer 112 is not connected with any other device structure.

However, the formed second dielectric layer 111 covers the conductive layer 112, the source-drain plug 113, and the gate plug 114, and the second dielectric layer 111 exposes the top surfaces of the conductive layer 112, the source-drain plug 113 and the gate plug 114. The semiconductor devices have been developed towards higher element density and higher integration degree, and, thus, the spacing between elements becomes smaller. Therefore, the spacing between the exposed conductive layer 112 and the source-drain plug 113 is substantially small. In the subsequent manufacturing process, the source-drain plug 113 needs to be electrically connected with other device structures. In such process, the formed device structure is also easily short-circuited with the conductive layer, thereby affecting the performance of the ultimately formed semiconductor structure.

Figure 11:
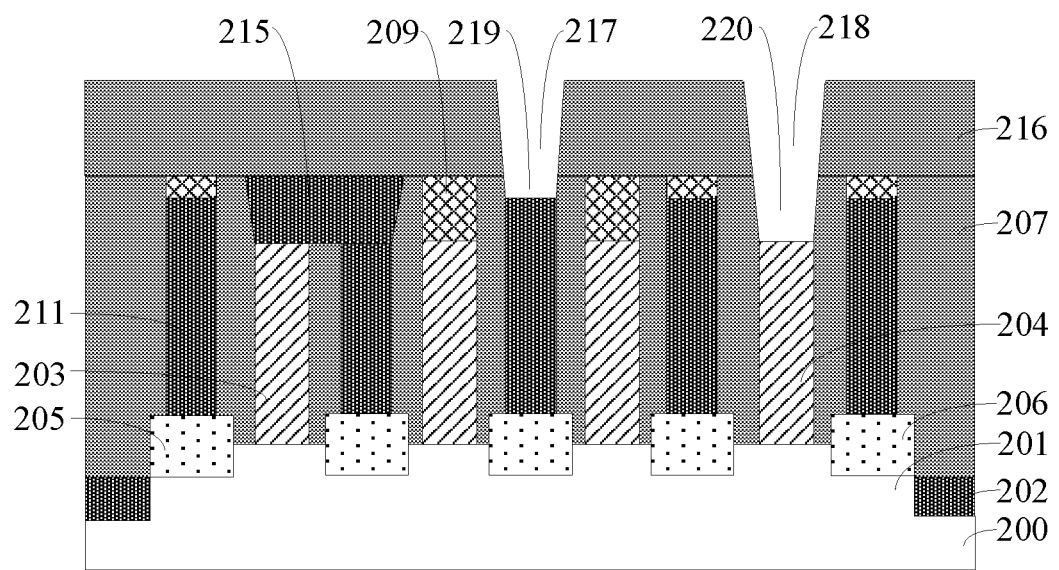
Figure 12:
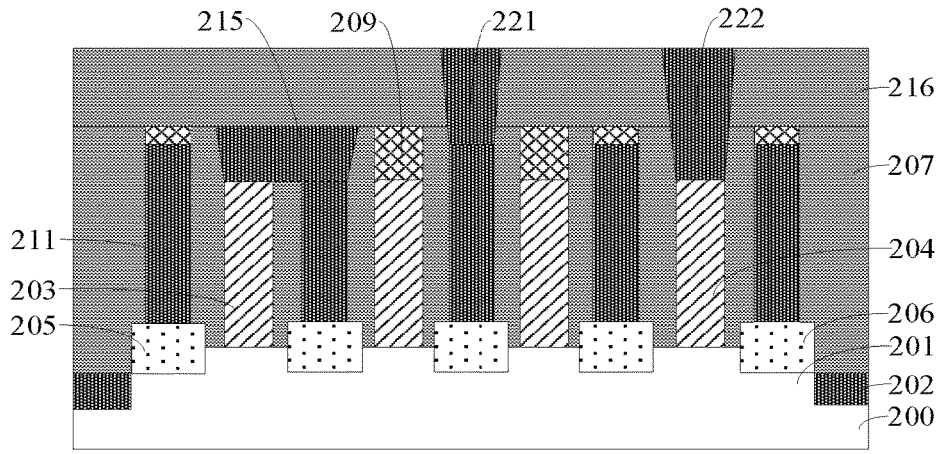
Figure 13:
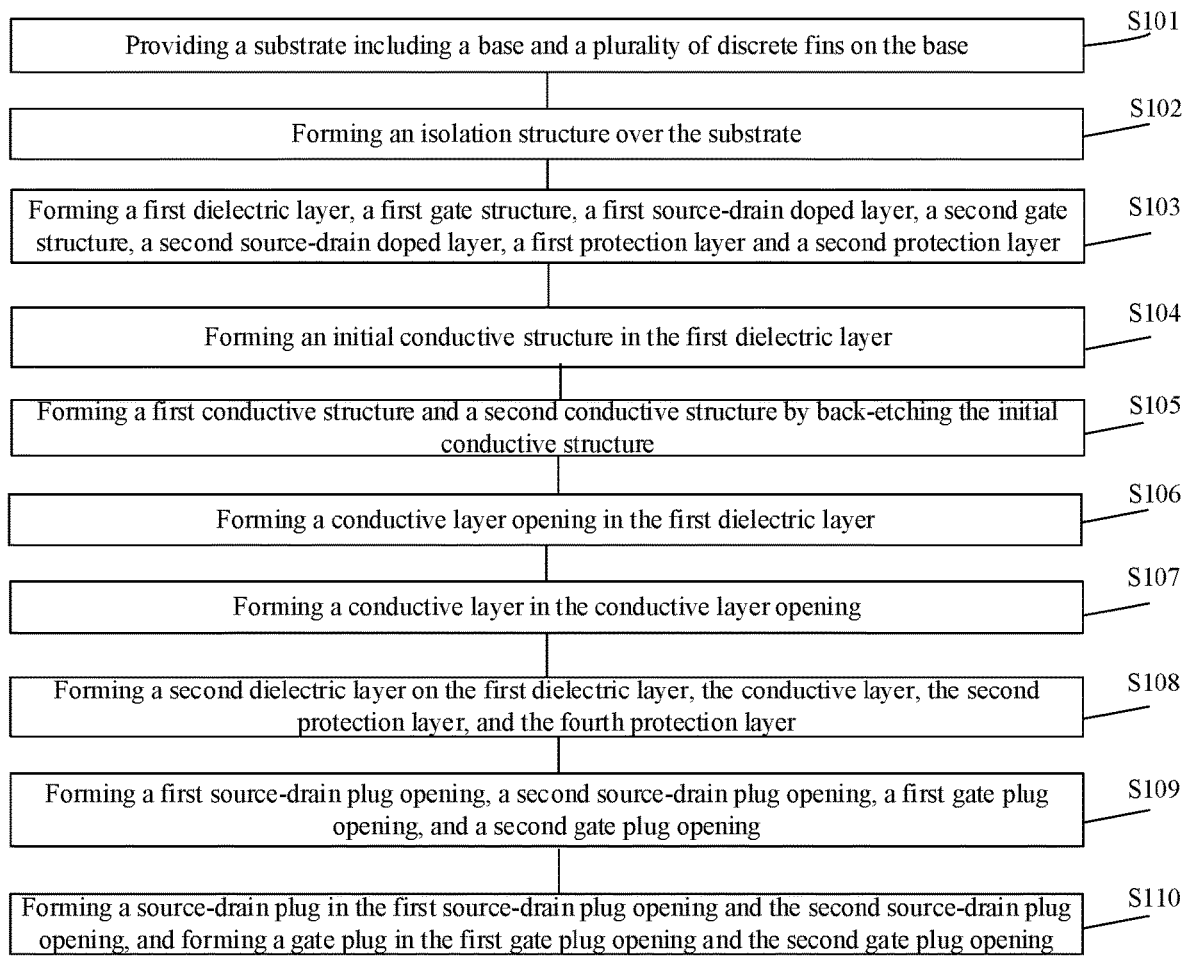
FIG. 13 illustrates a flowchart of an exemplary method for forming a semiconductor structure consistent with various disclosed embodiments of the present disclosure.

The present disclosure provides a semiconductor structure and a fabrication method thereof. FIG. 13 illustrates a flowchart of a method for forming a semiconductor structure consistent with various disclosed embodiments of the present disclosure, and FIGS. 3-12 illustrate semiconductor structures corresponding to certain stages of the fabrication method.

Figure 3:
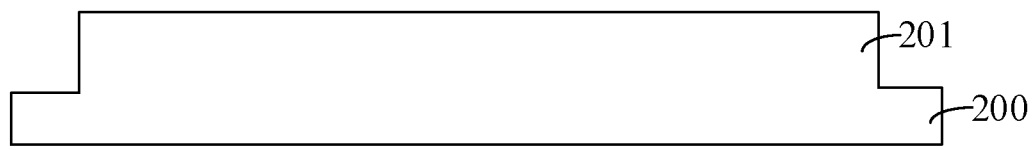
FIGS. 3-12 illustrate semiconductor structures corresponding to certain stages for forming an exemplary semiconductor structure consistent with various disclosed embodiments of the present disclosure.

As shown in FIG. 13, at the beginning of the fabrication method, a substrate including a base and a plurality of discrete fins on the base may be provided (S101). FIG. 3 illustrates a corresponding semiconductor structure.

Referring to FIG. 3, a substrate may be provided. In one embodiment, the substrate may include a base 200 and a plurality of discrete fins 201 on the base 200.

In one embodiment, forming the base 200 and the plurality of fins 201 may include providing an initial substrate (not illustrated); forming a patterned layer on the initial substrate; and etching the initial substrate using the patterned layer as a mask to form the base 200 and the plurality of fins 201.

In one embodiment, the base 200 may be made of monocrystalline silicon. In another embodiment, the base may be made of polysilicon or amorphous silicon. In certain embodiments, the substrate may be made of germanium, silicon germanium, gallium arsenide, or any other semiconductor material.

In one embodiment, the fin 201 may be made of monocrystalline silicon. In another embodiment, the fin may be made of monocrystalline silicon germanium, or any other semiconductor material. In certain embodiments, the substrate may not include the fin.

Figure 4:
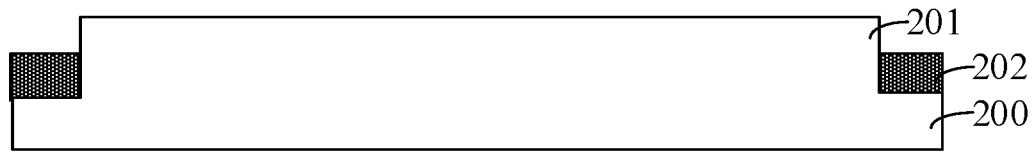

Returning to FIG. 13, after providing the substrate, an isolation structure may be formed over the substrate (S102). FIG. 4 illustrates a corresponding semiconductor structure.

Referring to FIG. 4, an isolation structure 202 may be formed over the substrate. In one embodiment, the isolation structure 202 may cover a portion of a sidewall of the fin 201, and a top surface of the isolation structure 202 may be lower than a top surface of the fin 201.

Forming the isolation structure 202 may include: forming an initial isolation structure (not illustrated) over the substrate, where the initial isolation structure may cover the fin 201; performing a planarization treatment on the initial isolation structure until the top surface of the fin 201 is exposed; and after performing the planarization treatment, removing a portion of the initial isolation structure to form the isolation structure 202. The top surface of the isolation structure 202 may be lower than the top surface of the fin 201.

In one embodiment, the process of performing the planarization treatment on the initial isolation structure may include a wet etching process. In another embodiment, the process of performing the planarization treatment on the initial isolation structure may include a dry etching process, or a chemical mechanical polishing process (CMP).

In one embodiment, the isolation structure 202 may be made of silicon oxide. In another embodiment, the isolation structure may be made of silicon nitride, or silicon oxynitride.

Figure 5:
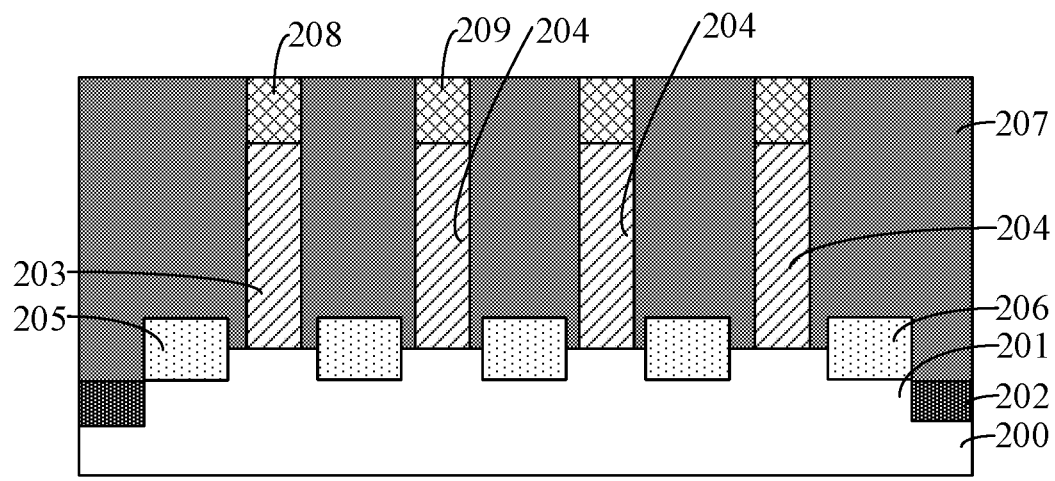

Returning to FIG. 13, after forming the isolation structure, a first dielectric layer, a first gate structure, a first source-drain doped layer, a second gate structure, a second source-drain doped layer, a first protection layer, and a second protection layer may be formed (S103). FIG. 5 illustrates a corresponding semiconductor structure.

Referring to FIG. 5, a first dielectric layer 207, a first gate structure 203 and a plurality of second gate structures 204 may be formed over the substrate. The first gate structure 203 may be adjacent to at least one of the plurality of second gate structures 204. A first protection layer 208 may be formed on a top the first gate structure 203, and a second protection layer 209 may be formed on a top of the second gate structure 204. A first source-drain doped layer 205 may be formed in the substrate between adjacent first gate structure 203 and second gate structure 204. The first dielectric layer 207 may cover the sidewall of the first gate structure 203 and the sidewall of the second gate structure 204, and may expose top surfaces of the first protection layer 208 and the second protection layer 209.

In one embodiment, the first dielectric layer 207, the first gate structure 203, and the second gate structure 204 may be specifically formed over the isolation structure 202.

In one embodiment, the first gate structure 203 may be across a length portion of the fin 201, and may cover a portion of sidewall and top surfaces of the fin 201. The second gate structure 204 may be across a length portion of the fin 201, and may cover a portion of sidewall and top surfaces of the fin 201.

In one embodiment, a second source-drain doped layer 206 may be formed in the substrate between adjacent second gate structures 204. In one embodiment, forming the first dielectric layer 207, the first gate structure 203, the second gate structure 204, the first source-drain doped layer 205, and the second source-drain doped layer 206 may include: forming a first dummy gate structure (not illustrated) and a second dummy gate structure (not illustrated) over the substrate; etching the fin 201 using the first dummy gate structure as a mask, to form a first source-drain opening (not illustrated) in the fin 201; etching the fin 201 using the second dummy gate structure as a mask, to form a second source-drain opening (not illustrated) in the fin 201; forming the first source-drain doped layer 205 in the first source-drain opening; forming the second source-drain doped layer 206 in the second source-drain opening; forming an initial first dielectric layer over the isolation structure 202, where the initial first dielectric layer may cover the first dummy gate structure, the second dummy gate structure, the first source-drain doped layer 205 and the second source-drain doped layer 206; performing a planarization treatment on the initial first dielectric layer until the top surfaces of the first dummy gate structure and the second dummy gate structure are exposed, to form the first dielectric layer 207; removing the first dummy gate structure and the second dummy gate structure, to form a first dummy gate opening (not illustrated) and a second dummy gate opening (not illustrated) in the first dielectric layer 207; forming the first gate structure 203 in the first dummy gate opening; and forming the second gate structure 204 in the second dummy gate opening.

Forming the first protection layer 208 and the second protection layer 209 may include: back-etching the first gate structure 203 and the second gate structure 204, to form a first gate groove (not illustrated) on the first gate structure 203 and a second gate groove (not illustrated) on the second gate structure 204; and forming the first protection layer 208 in the first gate groove and the second protection layer 209 in the second gate groove.

In one embodiment, the first gate structure 203 may include a first gate dielectric layer and a first gate electrode layer formed over the first gate dielectric layer. In one embodiment, the first gate dielectric layer may be made of a material including a high-K dielectric material. The first gate electrode layer may be made of a material including a metal such as tungsten, aluminum, copper, titanium, silver, gold, lead, or nickel. In one embodiment, the first gate electrode layer may be made of tungsten.

In one embodiment, the second gate structure 204 may include a second gate dielectric layer and a second gate electrode layer formed over the second gate dielectric layer. In one embodiment, the second gate dielectric layer may be made of a material including a high-K dielectric material. The second gate electrode layer may be made of a material including a metal such as tungsten, aluminum, copper, titanium, silver, gold, lead, or nickel. In one embodiment, the second gate electrode layer may be made of tungsten.

In one embodiment, the first dielectric layer 207 may be made of silicon oxide. In another embodiment, the first dielectric layer may be made of a low-K dielectric material (low-K dielectric material refers to a dielectric material with a relative dielectric constant less than 3.9) or an ultra-low-K dielectric material (ultra-low-K dielectric material refers to a dielectric material with a relative dielectric constant less than 2.5).

In one embodiment, the first protection layer 208 may be made of silicon nitride, and the second protection layer 209 may be made of silicon nitride.

After forming the first source-drain doped layer 205 and the second source-drain doped layer 206, the method may further include: forming a first conductive structure in the first dielectric layer 207 over the first source-drain doped layer 205, and forming a third protection layer on the top of the first conductive structure; and forming a second conductive structure in the first dielectric layer 207 over the second source-drain doped layer 206, and forming a fourth protection layer on the top of the second conductive structure. The detailed formation process may refer to FIGS. 6-7.

Figure 6:
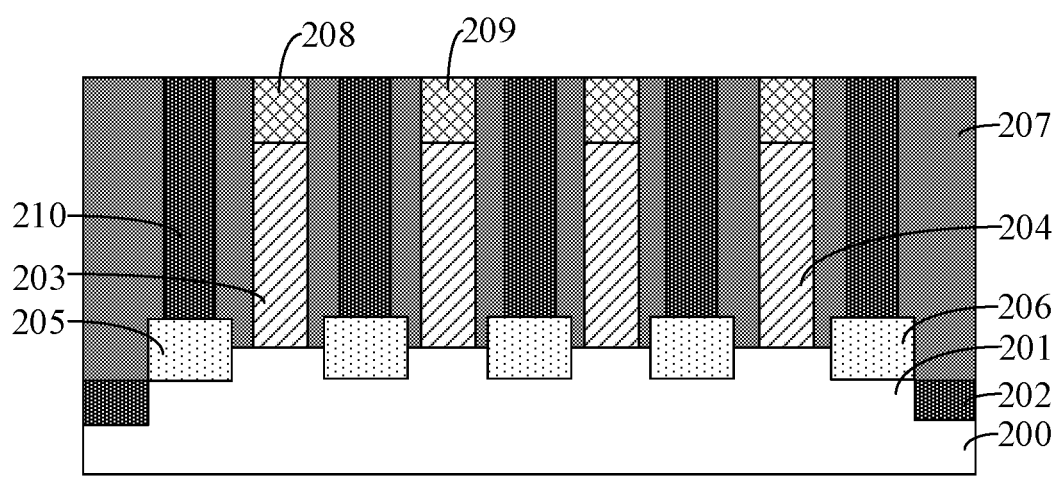

Returning to FIG. 13, after forming the first protection layer and the second protection layer, an initial conductive structure may be formed in the first dielectric layer (S104). FIG. 6 illustrates a corresponding semiconductor structure.

Referring to FIG. 6, a first source-drain conductive opening (not illustrated) and a second source-drain conductive opening (not illustrated) may be formed in the first dielectric layer. The first source-drain conductive opening may expose a top surface of the first source-drain doped layer 205, and the second source-drain conductive opening may expose a top surface of the second source-drain doped layer 206. An initial conductive structure 210 may be formed in the first source-drain conductive opening and the second source-drain conductive opening.

Figure 7:
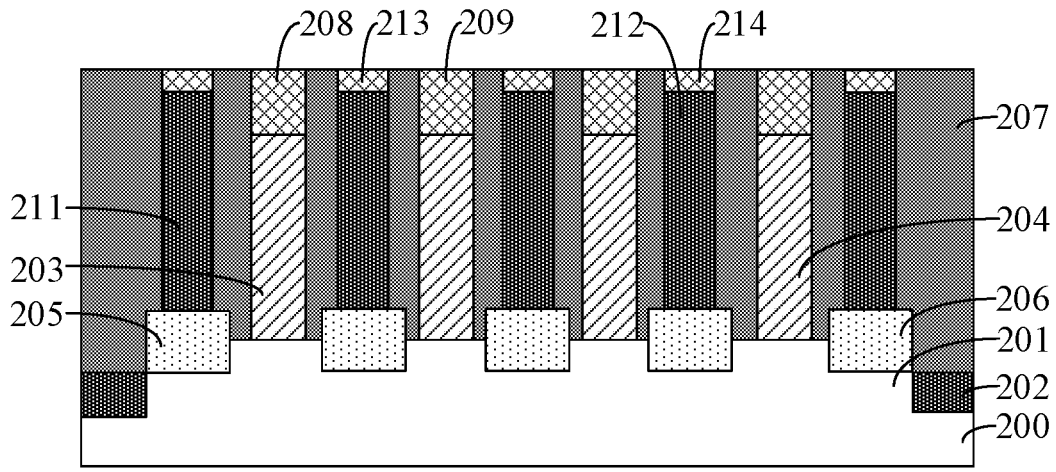

Returning to FIG. 13, after forming the initial conductive structure, a first conductive structure and a second conductive structure may be formed (S105). FIG. 7 illustrates a corresponding semiconductor structure.

Referring to FIG. 7, the initial conductive structure 210 may be back-etched to form a first conductive structure 211 and a second conductive structure 212. A third protection layer 213 may be formed over the first conductive structure 211, and a fourth protection layer 214 may be formed over the second conductive structure 212. In one embodiment, the first conductive structure 211 and the second conductive structure 212 may be simultaneously formed.

In one embodiment, the first conductive structure 211 may be made of tungsten. In another embodiment, the first conductive structure may be made of aluminum, copper, titanium, silver, gold, lead, or nickel. In one embodiment, the second conductive structure 212 may be made of tungsten. In another embodiment, the second conductive structure may be made of aluminum, copper, titanium, silver, gold, lead, or nickel.

Figure 8:
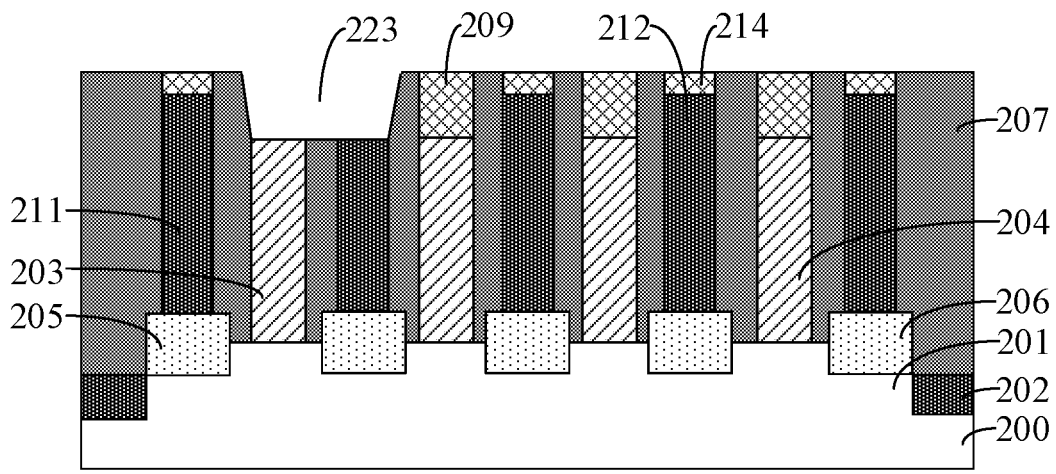

Returning to FIG. 13, after forming the third protection layer and the fourth protection layer, a conductive layer opening may be formed in the first dielectric layer (S106). FIG. 8 illustrates a corresponding semiconductor structure.

Referring to FIG. 8, the first protection layer 208 and the third protection layer 213 may be removed to form a conductive layer opening 223 in the first dielectric layer 207. In one embodiment, forming the conductive layer opening 223 may further include removing a portion of the first conductive structure 211.

In one embodiment, removing the first protection layer 208, the third protection layer 213, and the portion of the first conductive structure 211 may include a wet etching process. In another embodiment, removing the first protection layer, the third protection layer and the portion of the first conductive structure may include a dry etching process.

In one embodiment, the first protection layer 208 may be made of a same material as the third protection layer 213. When removing the first protection layer 208 and the third protection layer 213 to form the conductive layer opening 223, because the first protection layer 208 and the third protection layer 213 are made of the same material, etching selection ratios for the first protection layer 208 and the third protection layer 213 may be close, such that the first protection layer 208 and the third protection layer 213 may be simultaneously removed, thereby reducing the process steps and improving production efficiency. In one embodiment, the first protection layer 208 and the third protection layer 213 may be made of silicon nitride.

Figure 9:
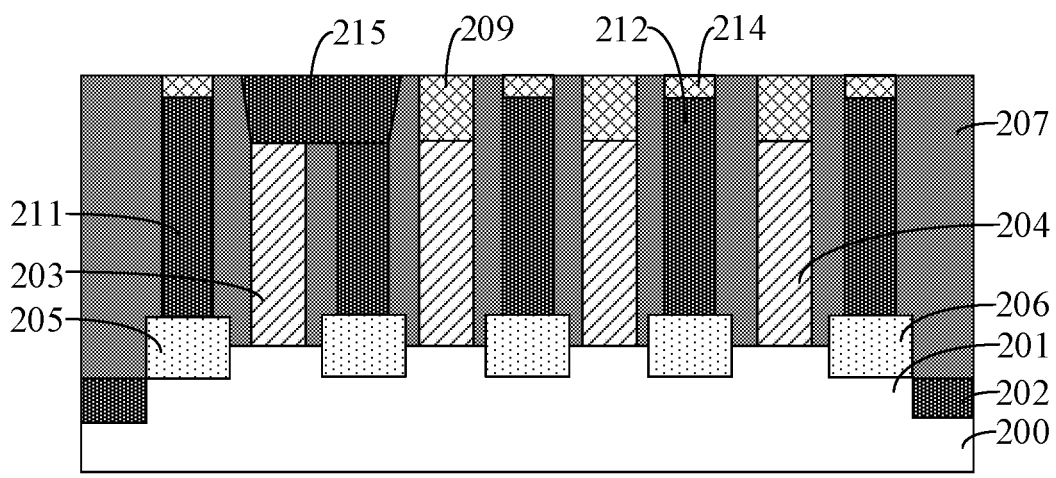

Returning to FIG. 13, after forming the conductive layer opening, a conductive layer may be formed (S107). FIG. 9 illustrates a corresponding semiconductor structure.

Referring to FIG. 9, a conductive layer 215 may be formed in the conductive layer opening 223, and a top surface of the conductive layer 215 may be coplanar with the top surface of the first dielectric layer 207.

The conductive layer 215 may be formed on the first conductive structure 211 and the first gate structure 203, to achieve the electrical connection between the first gate structure 203 and the first source-drain doped layer 205. The top surface of the conductive layer 215 may be coplanar with the top surface of the first dielectric layer 207. In the subsequent manufacturing process, a second dielectric layer may need to be formed over the conductive layer 215 and the first dielectric layer 207. The second dielectric layer may effectively reduce the short-circuit between the conductive layer 215 and any other device structure, thereby improving the electrical performance of the ultimately formed semiconductor structure.

In addition, the top surface of the conductive layer 215 may be coplanar with the top surface of the first dielectric layer 207, such that a certain height difference may be formed between the top surface of the conductive layer 215 and the top surface of a subsequently formed gate plug or a top surface of a subsequently formed source-drain plug, and the spacing between the conductive layer 215 and the gate plug or the source-drain plug may increase, thereby reducing the parasitic capacitance generated between the conductive layer 215 and the gate plug or the source-drain plug.

In one embodiment, forming the conductive layer 215 may include: forming an initial conductive layer (not illustrated) in the conductive layer opening 223, and on the first dielectric layer 207, the second protection layer 209, and the fourth protection layer 214; and planarizing the initial conductive layer until the top surfaces of the first dielectric layer 207, the second protection layer 209, and the fourth protection layer 214 are exposed, to form the conductive layer 215.

In one embodiment, the conductive layer 215 may be made of tungsten. In another embodiment, the conductive layer may be made of aluminum, copper, titanium, silver, gold, lead, or nickel.

Figure 10:
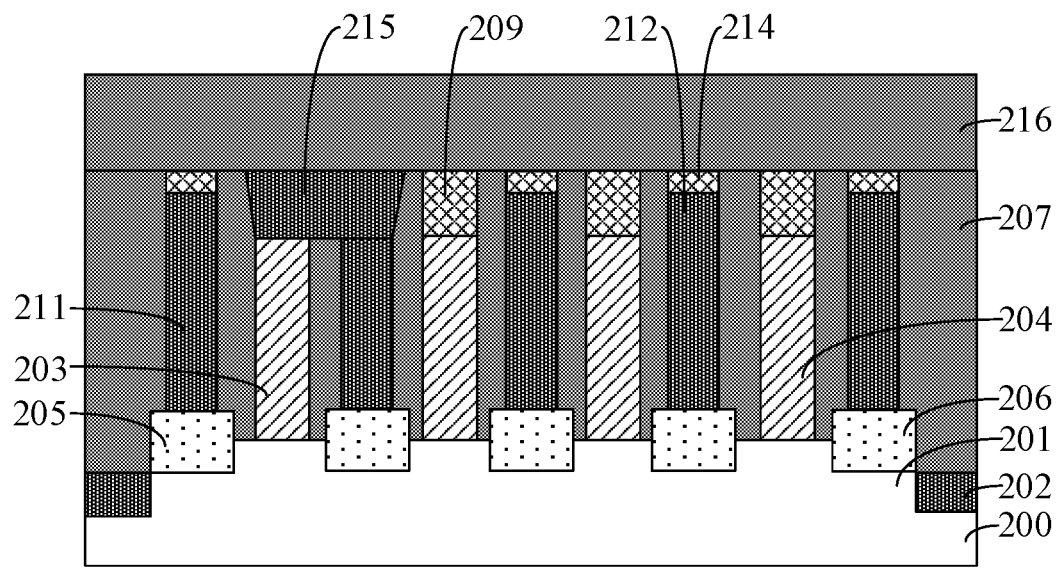

Returning to FIG. 13, after forming the conductive layer, a second dielectric layer may be formed (S108). FIG. 10 illustrates a corresponding semiconductor structure.

Referring to FIG. 10, after forming the conductive layer 215, a second dielectric layer 216 may be formed on the first dielectric layer 207, the conductive layer 215, the second protection layer 209, and the fourth protection layer 214.

In one embodiment, the second dielectric layer 216 may be made of silicon oxide. In another embodiment, the second dielectric layer may be made of a low-K dielectric material (low-K dielectric material refers to a dielectric material with a relative dielectric constant less than 3.9) or an ultra-low-K dielectric material (ultra-low-K dielectric material refers to a dielectric material with a relative dielectric constant less than 2.5).

After forming the second dielectric layer 216, a source-drain plug and a gate plug may be formed in the second dielectric layer 216. The second dielectric layer 216 may expose the top surfaces of the source-drain plug and the gate-plug. The source-drain plug may be extended into an inside of the first dielectric layer 207, and may be in contact with a portion of the second conductive structure 212. The gate plug may be extended into an inside of the first dielectric layer 207, and may be in contact with a portion of the second gate structure 204. For illustrative purposes, the specific formation process of the source-drain plug and the gate plug may refer to FIGS. 11-12.

Returning to FIG. 13, after forming the second dielectric layer, a first source-drain plug opening, a second source-drain plug opening, a first gate plug opening, and a second gate plug opening may be formed (S109). FIG. 11 illustrates a corresponding semiconductor structure.

Referring to FIG. 11, a first patterned layer (not illustrated) may be formed over the second dielectric layer 216, and the first patterned layer may expose a portion of the top surface of the second dielectric layer 216. The second dielectric layer 216 may be etched using the first patterned layer as a mask, to form a first source-drain plug opening 217 and a first gate plug opening 218 in the second dielectric layer 216. The first source-drain plug opening 217 may expose a portion of the top surface of the fourth protection layer 214, and the first gate plug opening 218 may expose a portion of the top surface of the second protection layer 209. The portion of the fourth protection layer 214 exposed by the first source-drain plug opening 217 may be etched until the top surface of the second conductive structure 212 is exposed, to form a second source-drain plug opening 219 in the first dielectric layer 207. The portion of the second protection layer 209 exposed by the first gate plug opening 218 may be etched until the top surface of the second gate structure 204 is exposed, to form a second gate plug opening 220 in the first dielectric layer 207. After forming the second source-drain plug opening 219 and the second gate plug opening 220, the first patterned layer may be removed.

In one embodiment, the first patterned layer may be made of a material including photoresist. Forming the first patterned layer may include a photolithography patterning process. Removing the first patterned layer may include an ashing process, and gas of the ashing process may include an oxygen-containing gas, e.g., oxygen or ozone.

Returning to FIG. 13, after forming the second source-drain plug opening and the second gate plug opening, a source-drain plug and a gate plug may be formed (S110). FIG. 12 illustrates a corresponding semiconductor structure.

Referring to FIG. 12, a source-drain plug 221 may be formed in the first source-drain plug opening 217 and the second source-drain plug opening 219, and a gate plug 222 may be formed in the first gate plug opening 218 and the second gate plug opening 220.

In one embodiment, the source-drain plug 221 and the gate plug 222 may be simultaneously formed. In one embodiment, the source-drain plug 221 may be made of a material including a metal, and the metal may include tungsten. In one embodiment, the gate plug 222 may be made of a material including a metal, and the metal may include tungsten.

Correspondingly, the present disclosure also provides a semiconductor structure. Referring to FIG. 12, the semiconductor structure may include a substrate, a first dielectric layer 207, a first gate structure 203 and a plurality of second gate structures 204 over the substrate. The first gate structure 203 may be adjacent to at least one of the plurality of second gate structures 204. A second protection layer 209 may be formed on a top of the second gate structure 204, and a first source-drain doped layer 205 may be formed between adjacent first gate structure 203 and second gate structure 204. The first dielectric layer 207 may cover the sidewall of the first gate structure 203 and the sidewall of the second gate structure 204, and may expose the top surface of the second protection layer 209.

In addition, the semiconductor structure may include a first conductive structure 211 in the first dielectric layer 207 over the first source-drain doped layer 205. Further, the semiconductor structure may include a conductive layer 215 formed on the first gate structure 203 and the first conductive structure 211. A top surface of the conductive layer 215 may be coplanar with a top surface of the first dielectric layer 207.

The conductive layer 215 may be formed on the first conductive structure 211 and the first gate structure 203, to achieve the electrical connection between the first gate structure 203 and the first source-drain doped layer 205. The top surface of the conductive layer 215 may be coplanar with the top surface of the first dielectric layer 207. In the subsequent manufacturing process, a second dielectric layer 216 may need to be formed over the conductive layer 215 and the first dielectric layer 207. The second dielectric layer 216 may effectively reduce the short-circuit between the conductive layer 215 and any other device structure, thereby improving the electrical performance of the ultimately formed semiconductor structure.

In addition, the top surface of the conductive layer 215 may be coplanar with the top surface of the first dielectric layer 207, such that a certain height difference may be formed between the top surface of the conductive layer 215 and a top surface of a subsequently formed gate plug 222 or a top surface of a subsequently formed source-drain plug 221, and the spacing between the conductive layer 215 and the gate plug 222 or the source-drain plug 221 may increase, thereby reducing the parasitic capacitance generated between the conductive layer 215 and the gate plug 222 or the source-drain plug 221.

In one embodiment, the semiconductor structure may further include: a second source-drain doped layer 206 formed in the substrate between adjacent second gate structures 204; a second conductive structure 212 formed in the first dielectric layer 207 over the second source-drain doped layer 206; and a fourth protection layer 214 formed on the top of the second conductive structure 212.

In one embodiment, the semiconductor structure may further include: a second dielectric layer 216 formed over the first dielectric layer 207, the conductive layer 215, the second protection layer 209, and the fourth protection layer 214; the source-drain plug 221 and the gate plug 222 formed in the second dielectric layer 216, where the second dielectric layer 216 may expose the top surfaces of the source-drain plug 221 and the gate plug 222. The source-drain plug 221 may be extended into an inside of the first dielectric layer 207, and may be in contact with a portion of the second conductive structure 212. The gate plug 222 may be extended into an inside of the first dielectric layer 207, and may be in contact with a portion of the second gate structure 204.

In one embodiment, the substrate may include a base 200 and a plurality of discrete fins 201 on the base 200. A first gate structure 203 may be across a length portion of the fin 201, and may cover a portion of sidewall and top surfaces of the fin 201. The second gate structure 204 may be across a length portion of the fin 201, and may cover a portion of sidewall and top surfaces of the fin 201.

In one embodiment, the first source-drain doped layer 205 may be formed in the fin 201, and the second source-drain doped layer 206 may be formed in the fin 201.

In one embodiment, the first gate structure 203 may include a first gate dielectric layer and a first gate electrode layer formed over the first gate dielectric layer. The second gate structure 204 may include a second gate dielectric layer and a second gate electrode layer formed over the second gate dielectric layer.

In one embodiment, the conductive layer 215 may be made of tungsten. In another embodiment, the conductive layer may be made of aluminum, copper, titanium, silver, gold, lead, or nickel.

In one embodiment, the first conductive structure 211 may be made of a material including a metal, and the metal may include tungsten. In another embodiment, the first conductive structure may be made of a material including aluminum, copper, titanium, silver, gold, lead, or nickel.

In one embodiment, the second conductive structure 212 may be made of a material including a metal, and the metal may include tungsten. In another embodiment, the second conductive structure may be made of a material including aluminum, copper, titanium, silver, gold, lead, or nickel.

The disclosed embodiments may have following beneficial effects. In the disclosed embodiments of the present disclosure, the conductive layer may be formed on the first conductive structure and the first gate structure, to achieve the electrical connection between the first gate structure and the first source-drain doped layer. The top surface of the conductive layer may be coplanar with the top surface of the first dielectric layer. In the subsequent manufacturing process, the second dielectric layer may need to be formed on the conductive layer and the first dielectric layer. The second dielectric layer may effectively reduce the short-circuit between the conductive layer and any other device structure, thereby improving the electrical performance of the ultimately formed semiconductor structure.

In addition, the top surface of the conductive layer may be coplanar with the top surface of the first dielectric layer, such that a certain height difference may be formed between the top surface of the conductive layer and the top surface of the subsequently formed gate plug or the top surface of the subsequently formed source-drain plug, and the spacing between the conductive layer and the gate plug or the source-drain plug may increase, thereby reducing the parasitic capacitance generated between the conductive layer and the gate plug or the source-drain plug.

Further, the first protection layer may be made of a same material as the third protection layer. When removing the first protection layer and the third protection layer to form the conductive layer opening, because the first protection layer and the third protection layer are made of the same material, the etching selection ratios for the first protection layer and the third protection layer may be close, such that the first protection layer and the third protection layer may be simultaneously removed, thereby reducing the process steps and improving production efficiency.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a substrate;
   a first gate structure over the substrate;
   a second gate structure over the substrate;
   a protection layer formed on a top of the second gate structure;
   a first source-drain doped layer formed between the first gate structure and the second gate structure;
   a first dielectric layer formed on the substrate, covering a sidewall of the first gate structure and a sidewall of the second gate structure, and exposing a top surface of the protection layer;
   a first conductive structure in the first dielectric layer over the first source-drain doped layer;
   a conductive layer on the first gate structure and the first conductive structure, wherein a top surface of the conductive layer is coplanar with a top surface of the first dielectric layer;
   a second source-drain doped layer, formed between the second gate structure and a third gate structure;
   a second conductive structure, formed in the first dielectric layer over the second source-drain doped layer;
   a second dielectric layer, formed over the first dielectric layer, the conductive layer, and the protection layer;
   a source-drain plug formed in the second dielectric layer, extending into an inside of the first dielectric layer, and being in contact with a portion of the second conductive structure, a bottom surface of the source-drain plug being lower than the top surface of the conductive layer, and a top surface of the source-drain plug being higher than the top surface of the conductive layer; and
   a gate plug, formed in the second dielectric layer, extending into an inside of the first dielectric layer, and being in contact with a portion of the third gate structure, a bottom surface of the gate plug being lower than the top surface of the conductive layer, and a top surface of the gate plug being higher than the top surface of the conductive layer;
   wherein the second dielectric layer exposes top surfaces of the source-drain plug and the gate plug.

2. The semiconductor structure according to claim 1, wherein:
   the substrate includes a base and a plurality of discrete fins formed on the base;
   the first gate structure is across a length portion of a fin of the plurality of discrete fins, and covers a portion of sidewall and top surfaces of the fin; and
   the second gate structure is across a length portion of the fin, and covers a portion of sidewall and top surfaces of the fin.

3. The semiconductor structure according to claim 2, wherein:
   the first source-drain doped layer is formed in the fin, and
   the second source-drain doped layer is formed in the fin.

4. The semiconductor structure according to claim 1, wherein:
   the first gate structure includes a first gate dielectric layer and a first gate electrode layer formed over the first gate dielectric layer; and
   the second gate structure includes a second gate dielectric layer and a second gate electrode layer formed over the second gate dielectric layer.

5. The semiconductor structure according to claim 1, wherein:
   the conductive layer is made of a material including a metal, and the metal includes tungsten, aluminum, copper, titanium, silver, gold, lead, nickel, or a combination thereof.

6. The semiconductor structure according to claim 1, wherein:
   the first conductive structure is made of a material including a metal, and the metal includes tungsten, aluminum, copper, titanium, silver, gold, lead, nickel, or a combination thereof.

7. The semiconductor structure according to claim 1, wherein:
   the second conductive structure is made of a material including a metal, and the metal includes tungsten, aluminum, copper, titanium, silver, gold, lead, nickel, or a combination thereof.

8. A method for forming a semiconductor structure, comprising:
   providing a substrate;
   forming a first gate structure over the substrate;
   forming a second gate structure over the substrate;
   forming a protection layer on a top of the second gate structure;
   forming a first source-drain doped layer between the first gate structure and the second gate structure;
   forming a first dielectric layer on the substrate, to cover a sidewall of the first gate structure and a sidewall of the second gate structure, and expose top surfaces of the first protection layer and the protection layer;
   forming a first conductive structure in the first dielectric layer over the first source-drain doped layer;
   forming a conductive layer on the first gate structure and the first conductive structure, wherein a top surface of the conductive layer is coplanar with a top surface of the first dielectric layer;
   forming a second source-drain doped layer between the second gate structure and a third gate structure;

forming a second conductive structure in the first dielectric layer over the second source-drain doped layer;

forming a second dielectric layer over the first dielectric layer, the conductive layer, and the protection layer;

forming a source-drain plug in the second dielectric layer, to extend into an inside of the first dielectric layer, and to be in contact with a portion of the second conductive structure, a bottom surface of the source-drain plug being lower than the top surface of the conductive layer, and a top surface of the source-drain plug being higher than the top surface of the conductive layer; and forming a gate plug in the second dielectric layer, to extend into an inside of the first dielectric layer, and to be in contact with a portion of the third gate structure, a bottom surface of the gate plug being lower than the top surface of the conductive layer, and a top surface of the gate plug being higher than the top surface of the conductive layer;

wherein the second dielectric layer exposes top surfaces of the source-drain plug and the gate plug.

9. The method according to claim 8, wherein:
the first conductive structure and the second conductive structure are simultaneously formed.

10. The method according to claim 9, wherein forming the first conductive structure and the second conductive structure includes:

forming a first source-drain conductive opening and a second source-drain conductive opening in the first dielectric layer, wherein the first source-drain conductive opening exposes a top surface of the first source-drain doped layer, and the second source-drain conductive opening exposes a top surface of the second source-drain doped layer;

forming an initial conductive structure in the first source-drain conductive opening and the second source-drain conductive opening;

back-etching the initial conductive structure to form the first conductive structure and the second conductive structure.

11. The method according to claim 8, wherein:
the source-drain plug and the gate plug are simultaneously formed.

12. The method according to claim 11, wherein forming the source-drain plug and the gate plug includes:

forming a first patterned layer over the second dielectric layer, wherein the first patterned layer exposes a portion of a top surface of the second dielectric layer;

etching the second dielectric layer using the first patterned layer as a mask, to form a first source-drain plug opening and a first gate plug opening in the second dielectric layer, wherein the first source-drain plug opening exposes a portion of a top surface of the fourth protection layer, and the first gate plug opening exposes a portion of a top surface of the second protection layer;

etching the portion of the fourth protection layer exposed by the first source-drain plug opening until a top surface of the second conductive structure is exposed, to form a second source-drain plug opening in the first dielectric layer;

etching the portion of the second protection layer exposed by the first gate plug opening until a top surface of the second gate structure is exposed, to form a second gate plug opening in the first dielectric layer;

forming the source-drain plug in the first source-drain plug opening and the second source-drain plug opening; and forming the gate plug in the first gate plug opening and the second gate plug opening.

13. The method according to claim 8, further comprising:

forming a first dummy gate structure and a second dummy gate structure over the substrate;

forming the first dielectric layer over the substrate, wherein the first dielectric layer covers the first dummy gate structure and the second dummy gate structure, and exposes top surfaces of the first dummy gate structure and the second dummy gate structure;

removing the first dummy gate structure and the second dummy gate structure, to form a first dummy gate opening and a second dummy gate opening in the first dielectric layer;

forming the first gate structure in the first dummy gate opening;

forming the second gate structure in the second dummy gate opening;

back-etching the first gate structure and the second gate structure, to form a first gate groove on the first gate structure and a second gate groove on the second gate structure; and forming the protection layer in the second gate groove.

14. The method according to claim 8, wherein:
the substrate includes a base and a plurality of discrete fins formed on the base;

the first gate structure is across a length portion of a fin of the plurality of discrete fins, and covers a portion of sidewall and top surfaces of the fin; and the second gate structure is across a length portion of the fin, and covers a portion of sidewall and top surfaces of the fin.

15. The method according to claim 14, wherein:
the first source-drain doped layer is formed in the fin, and the second source-drain doped layer is formed in the fin.

* * * * *